United States Patent
Lim et al.

(10) Patent No.: US 11,005,175 B2
(45) Date of Patent: May 11, 2021

(54) HYBRID METAL SHEET FOR MAGNETIC SHIELDING AND WIRELESS POWER TRANSMISSION MODULE INCLUDING SAME

(71) Applicant: Amosense Co., Ltd., Cheonan-si (KR)

(72) Inventors: Hyun Chul Lim, Gwangmyeong-si (KR); Kil Jae Jang, Seongnam-si (KR)

(73) Assignee: Amosense Co., Ltd., Cheonan-si (KR)

(*) Notice: Subject to any disclaimer, the term of this patent is extended or adjusted under 35 U.S.C. 154(b) by 171 days.

(21) Appl. No.: 16/302,794

(22) PCT Filed: May 30, 2017

(86) PCT No.: PCT/KR2017/005615
§ 371 (c)(1),
(2) Date: Nov. 19, 2018

(87) PCT Pub. No.: WO2017/209481
PCT Pub. Date: Dec. 7, 2017

(65) Prior Publication Data
US 2019/0296432 A1    Sep. 26, 2019

(30) Foreign Application Priority Data

May 31, 2016   (KR) .......................... 10-2016-0067534

(51) Int. Cl.
*H02J 50/10* (2016.01)
*H01Q 1/52* (2006.01)
(Continued)

(52) U.S. Cl.
CPC .............. *H01Q 1/526* (2013.01); *B32B 3/14* (2013.01); *B32B 7/12* (2013.01); *B32B 15/011* (2013.01);
(Continued)

(58) Field of Classification Search
None
See application file for complete search history.

(56) References Cited

U.S. PATENT DOCUMENTS

| 2015/0102892 | A1  | 4/2015 | Yeo et al. |           |
|--------------|-----|--------|------------|-----------|
| 2018/0062417 | A1* | 3/2018 | Choi       | H02J 50/10 |
| 2019/0097461 | A1* | 3/2019 | Singh      | H01F 38/14 |

FOREIGN PATENT DOCUMENTS

| JP | 11-087989 A   | 3/1999  |
| JP | 2008-296431 A | 12/2008 |

(Continued)

OTHER PUBLICATIONS

International Search Report dated Oct. 11, 2017 for International Application No. PCT/KR2017/005615; 4 Pages.

*Primary Examiner* — Jared Fureman
*Assistant Examiner* — Aqeel H Bukhari
(74) *Attorney, Agent, or Firm* — Daly, Crowley, Mofford & Durkee, LLP

(57) ABSTRACT

Provided are a hybrid metal sheet for magnetic shielding and a wireless power transmission module including the same. The hybrid metal sheet for magnetic shielding according to an embodiment of the present invention comprises: a first sheet layer made of a ribbon sheet of an amorphous alloy having a first width; and a plurality of second sheet layers stacked in multiple layers on one side of the first sheet layer, wherein the second sheet layer may be a sheet layer formed by arranging a plurality of divided sheets having a second width narrower than the first width and made of a ribbon sheet of a nano-crystal alloy on the same plane.

11 Claims, 13 Drawing Sheets

(51) Int. Cl.
*B32B 3/14* (2006.01)
*B32B 15/01* (2006.01)
*B32B 7/12* (2006.01)
*H05K 9/00* (2006.01)
*H01Q 1/22* (2006.01)
*H02J 50/70* (2016.01)
*C22C 45/02* (2006.01)

(52) U.S. Cl.
CPC ............ *B32B 15/013* (2013.01); *C22C 45/02* (2013.01); *H01Q 1/22* (2013.01); *H01Q 1/52* (2013.01); *H02J 50/10* (2016.02); *H02J 50/70* (2016.02); *H05K 9/00* (2013.01); *B32B 2307/212* (2013.01); *B32B 2307/702* (2013.01)

(56) References Cited

FOREIGN PATENT DOCUMENTS

| KR | 10-2013-0000743 A | 1/2013 |
| KR | 10-2013-0072181 A | 7/2013 |
| KR | 10-2013-0090385 A | 8/2013 |
| KR | 10-1331406 B1 | 11/2013 |
| KR | 10-2015-0032382 A | 3/2015 |
| KR | 10-2015-0043087 A | 4/2015 |

* cited by examiner

HYBRID METAL SHEET FOR MAGNETIC SHIELDING AND WIRELESS POWER TRANSMISSION MODULE INCLUDING SAME

CROSS-REFERENCE TO RELATED APPLICATION

This application is a U.S. National Stage of PCT/KR2017/005615 filed in the Korean language on May 30, 2017, entitled "HYBRID METAL SHEET FOR MAGNETIC SHIELDING AND WIRELESS POWER TRANSMISSION MODULE INCLUDING SAME," which application claims the priority benefit of Korean Patent Application No. 10-2016-0067534 filed on May 31, 2016 in the Korean Intellectual Property Office, the disclosure of which is incorporated herein by reference.

BACKGROUND OF THE DISCLOSURE

Field of the Disclosure

The present invention relates to a shielding sheet for magnetic field shielding, and more particularly to a hybrid metal sheet for magnetic field shielding and a wireless power transmission module including the same.

Description of the Related Art

An antenna generally refers to a device that converts an electrical signal into a radio signal. In recent years, by using these antennas, there have been to made to combine a near field communication (NFC), a wireless power transmission (WPT), a magnetic security transmission (MST) functions through an electronic device including various portable terminal devices (Smart phone, tablet PC, etc.).

The electronic device including the above-described antenna uses a magnetic field shielding sheet to solve the problem because it adversely affects the functions of other components included in the electronic device due to the magnetic field generated when the antenna is operated.

That is, the magnetic field shielding sheet shields the magnetic field to isolate other parts in the electronic device from the magnetic field, and condenses the magnetic field in a desired direction. This makes it possible to improve the transmission/reception communication of the antennas matched with each other, and to prevent deterioration of functions of other components due to the magnetic field.

At this time, when the magnetic field shielding sheet to be used has an excellent magnetic permeability only in a specific frequency band, the following problem arises.

When an antenna in which a combination of near field communication (NFC), wireless power transmission (WPT), and magnetic security transmission (MST) functions using different frequency bands are embedded in one electronic device, any one function may be maintained or improved. That is, there is a problem that it is very difficult to maintain or improve any one of the functions of the complex antenna functions.

In order to solve this problem, there has been an attempt to realize a magnetic field shielding sheet using a Fe-based amorphous ribbon sheet. In the case of the Fe-based amorphous ribbon sheet, the performance is excellent in the low frequency band of 1 MHz or less due to high saturated magnetic flux density, however, the performance is a bad in the high frequency band of 1 MHz or more.

On the other hand, the magnetic field shielding sheet made of the ribbon sheet of the nano-crystal alloy has a lower permeability loss rate in the high frequency band than the Fe-based amorphous ribbon sheet. Therefore, there is an advantage in improving the performance of an antenna using a high frequency band. However, the ribbon sheet of the nano-crystal alloy has a problem that the production cost is increased when the ribbon sheet is manufactured with a width of 60 mm or more due to the characteristics of the manufacturing process involving rapid cooling or heat treatment.

SUMMARY OF THE DISCLOSURE

To solve the above problems and defects, it is an object of the present invention to provide a hybrid metal sheet for magnetic field shielding that may be used in a composite antenna while reducing the production cost by using a ribbon sheet of a nano-crystal alloy having a narrow width, for example, a width of 60 mm or less.

It is another object of the present invention to provide a wireless power transmission module that may be applied to a light-weighted electronic device by implementing the wireless power transmission module through the above-described hybrid metal sheet for magnetic field shielding.

To accomplish the above and other objects of the present invention, according to an aspect of the present invention, there is provided a hybrid metal sheet for magnetic field shielding including a first sheet layer made of a ribbon sheet of an amorphous alloy having a first width, and a plurality of second sheet layers laminated in multiple layers on one surface of the first sheet layer. Wherein the second sheet layer is a sheet layer formed by arranging a plurality of divided sheets of a ribbon sheet of a nano-crystal alloy on the same plane and has a second width narrower than the first width.

The second sheet layer may be in the form of a plurality of divided sheets arranged in an m×n matrix structure (where m and n are natural numbers). In one example, the second sheet layer may be implemented as a sheet layer in which a plurality of divided sheets is arranged in a matrix structure of 4×2 or 6×1.

In addition, the first sheet layer may be disposed only on a side of the second sheet layer. At this time, the first sheet layer may be a single layer, or a plurality of first sheet layers may be stacked on a side of the second sheet layer.

In addition, the plurality of second sheet layers may be disposed between the two first sheet layers.

The plurality of second sheet layers may be arranged such that a plurality of divided sheets for constituting each layer are arranged in the same direction along the width direction or the longitudinal direction of the first sheet layer.

A boundary region formed between two divided sheets constituting one of a plurality of second sheet layers may be may be continuous or discontinuous with a boundary region formed between the divided sheets constituting another second sheet layer disposed on the upper or lower portion of any one of the second sheet layers.

The plurality of divided sheets for constituting any one of a plurality of second sheet layers may be arranged along a first direction. The plurality of divided sheets constituting the second sheet layer disposed on at least one of the upper and lower sides of the one of the second sheet layers may be arranged along a second direction different from the first direction.

In addition, the plurality of second sheet layers may be stacked in a multilayer of three to ten layers The amorphous alloy may be a Fe-based amorphous alloy.

Meanwhile, the present invention provides a wireless power transmission module comprising an antenna unit including at least one antenna for wireless power transmission, and a hybrid metal sheet for magnetic field shielding disposed on one surface of the antenna unit.

Also, the antenna unit may further include at least one other antenna using a different frequency band from the antenna for wireless power transmission, and the other antenna may be a near field communication (NFC) antenna, a magnetic security transmission (MST) antenna.

According to the present invention, it is possible to realize a shielding sheet by using a ribbon sheet of a nano-crystal alloy having a narrow width of 60 mm or less, thereby effectively applying the shielding sheet to a composite antenna while reducing the production cost. Therefore, the present invention can be applied to a light-weighted and small electronic device.

DETAILED DESCRIPTION OF THE DISCLOSURE

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art. Further, if it is determined that the detailed description of the known art related to the present invention makes the gist of the present invention unnecessarily obscure, a detailed description thereof will be omitted.

As shown in FIGS. 1 to 10, hybrid metal sheets 110, 110', 210, 210' and 310 for magnetic field shielding according to an embodiment of the present invention may include a first sheet layer 111 and a plurality of second sheet layers 112.

Here, the first sheet layer 111 and the second sheet layer 112 may be made of different materials, and the first sheet layer 111 may be a ribbon sheet of an amorphous alloy, the second sheet layer 112 may be a ribbon sheet of nanocrystalline alloy.

In the present invention, the ribbon sheet of the amorphous alloy may be a ribbon sheet of a known Fe-based amorphous alloy. As a specific example, the Fe-based amorphous alloy may be a 3 element sub-alloy including iron (Fe), silicon (Si) and boron (B) or, a 5-element sub-alloy including iron (Fe), silicon (Si), boron (B), copper (Cu) and niobium (Nb). In addition, the ribbon sheet of the nanocrystalline alloy may be a ribbon sheet heat-treated with a Fe-based amorphous alloy, or may be a ribbon sheet heat-treated with a Co-based amorphous alloy.

When the hybrid metal sheets 110, 110', 210, 210', 310 for the magnetic field shielding according to the present invention are applied to an antenna unit including an antenna using a low frequency band and an antenna using a high frequency band, the performance of the antenna using the low-frequency band as well as the antenna using the high-frequency band may be enhanced.

Figure 12:
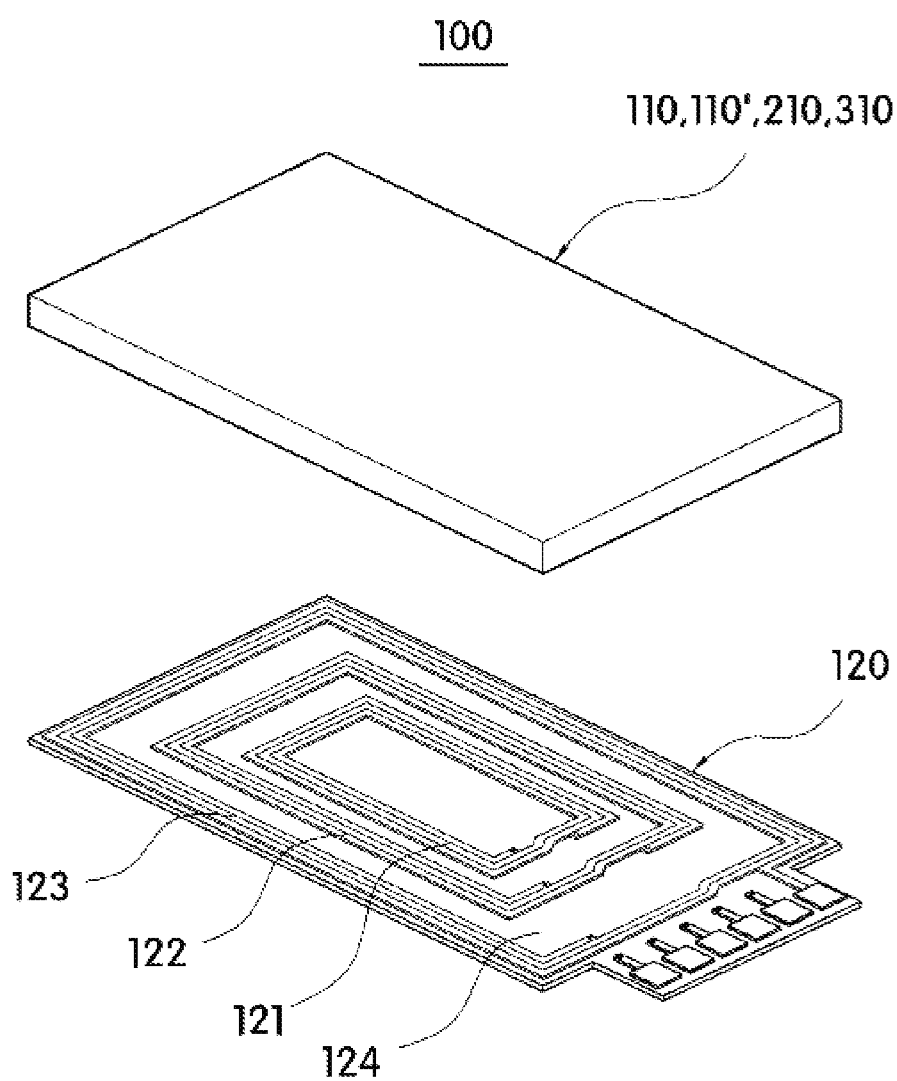
FIG. 12 is a schematic view of a wireless power transmission module to which the hybrid metal sheet for magnetic field shielding according to the present invention is applied.

Here, the antenna using the low frequency band may a wireless power transmission antenna 121 of a magnetic induction method using 100 to 350 kHz, or a magnetic secure transmission antenna 122 using a frequency of 100 kHz or less. The antenna using the high frequency band may be a Near Field Communication antenna 123 using 13.56 MHz, or a wireless power transmission antenna of a magnetic resonance method using 6.78 MHz (refer to FIG. 12). In addition, the antenna 121 for the wireless power transmission of the magnetic induction method may be an antenna included in the wireless power transmission module using the permanent magnet.

The Fe-based amorphous ribbon sheet may exhibit excellent performance due to its high saturation magnetic flux density in a low frequency band of 1 MHz or less, and thus may be suitable for improving the performance of an antenna using a low frequency band of 1 MHz or less.

In addition, the ribbon sheet of the nanocrystalline alloy may have a lower permeability loss rate in the high frequency band than the Fe amorphous ribbon sheet. Therefore, the ribbon sheet may exert a superior performance over a certain level in a relatively high frequency band relative to the ribbon sheet of the amorphous alloy. That is, the ribbon sheet may be advantageous in improving the performance of an antenna using a high frequency band.

Accordingly, the magnetic shielding hybrid metal sheets 110, 110', 210, 210' and 310 according to the present invention may improve the performance of an antenna operating in a low frequency band through the first sheet layer 111 made of a ribbon sheet of an amorphous alloy. The hybrid metal sheets 110, 110', 210, 210' and 310 may increase the performance of an antenna operating in a high frequency band through the second sheet layer 112 made of a ribbon sheet of nano-crystal alloy. Therefore, the hybrid metal sheets 110, 110', 210, 210', and 310 may exhibit performance over a certain level in a low frequency band and a high frequency band through one sheet.

The first sheet layer 111 may be a plate-shaped ribbon sheet having a first width and a predetermined area. The second sheet layer 112 having a second width may be configured such that a plurality of divided sheets 112*a* and 112*a*' made of a ribbon sheet of a nanocrystalline alloy are arranged adjacent to each other to constitute one layer.

Figure 1:
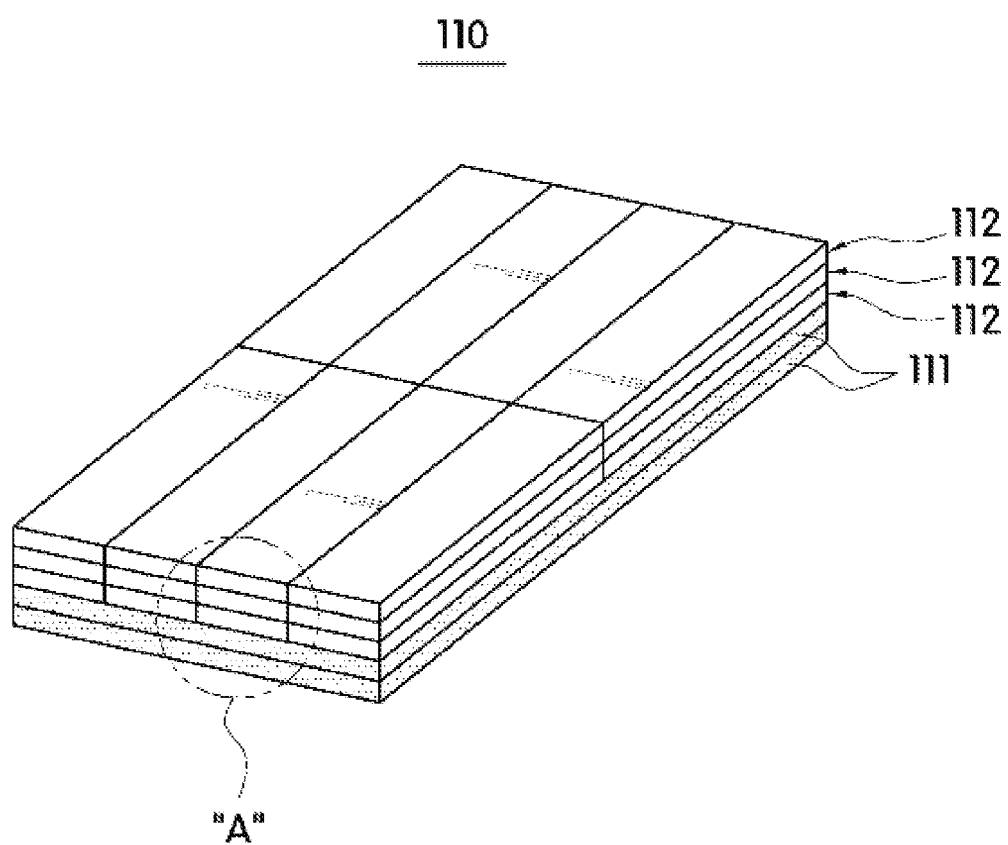
FIG. 1 is a view showing a hybrid metal sheet for magnetic field shielding according to a first embodiment of the present invention.
Figure 2:
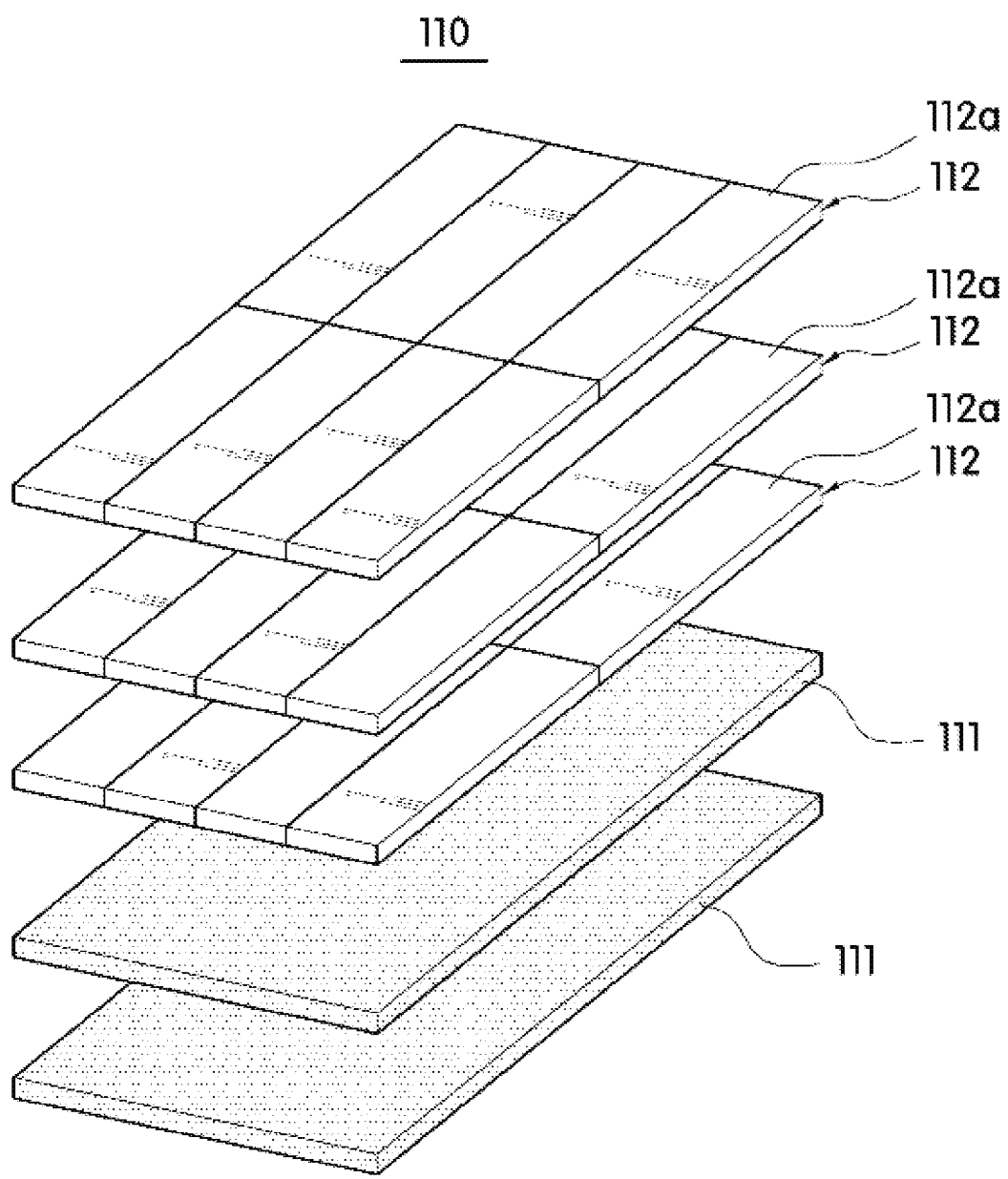
FIG. 2 shows the separation diagram of FIG. 1.
Figure 3:
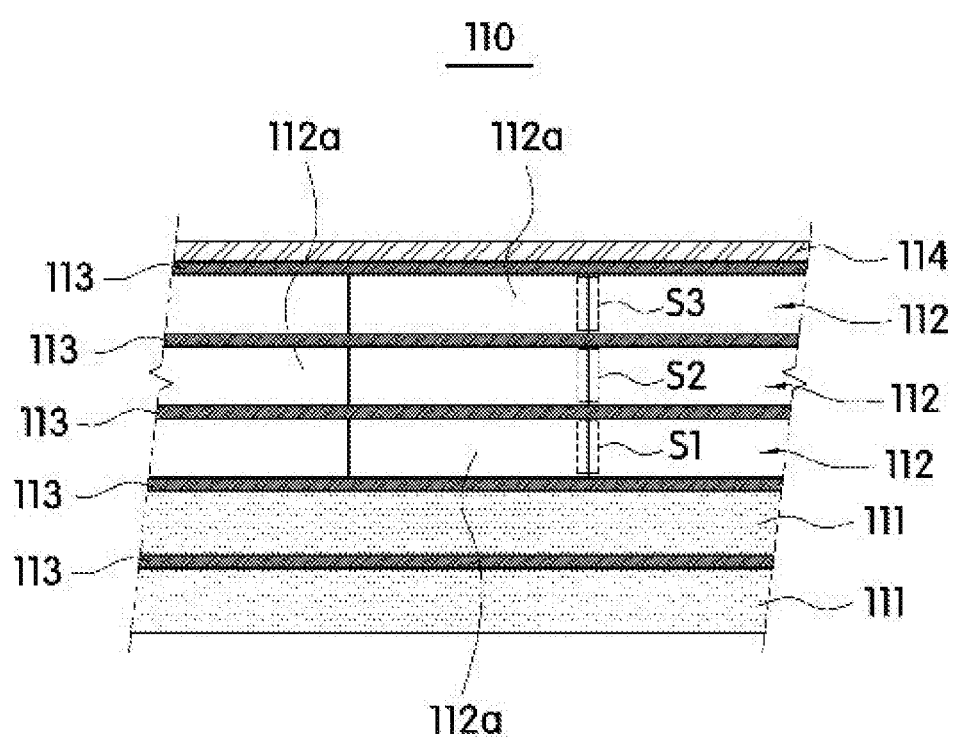
FIG. 3 is an enlarged sectional view of the portion "A" in FIG. 1.
Figure 4:
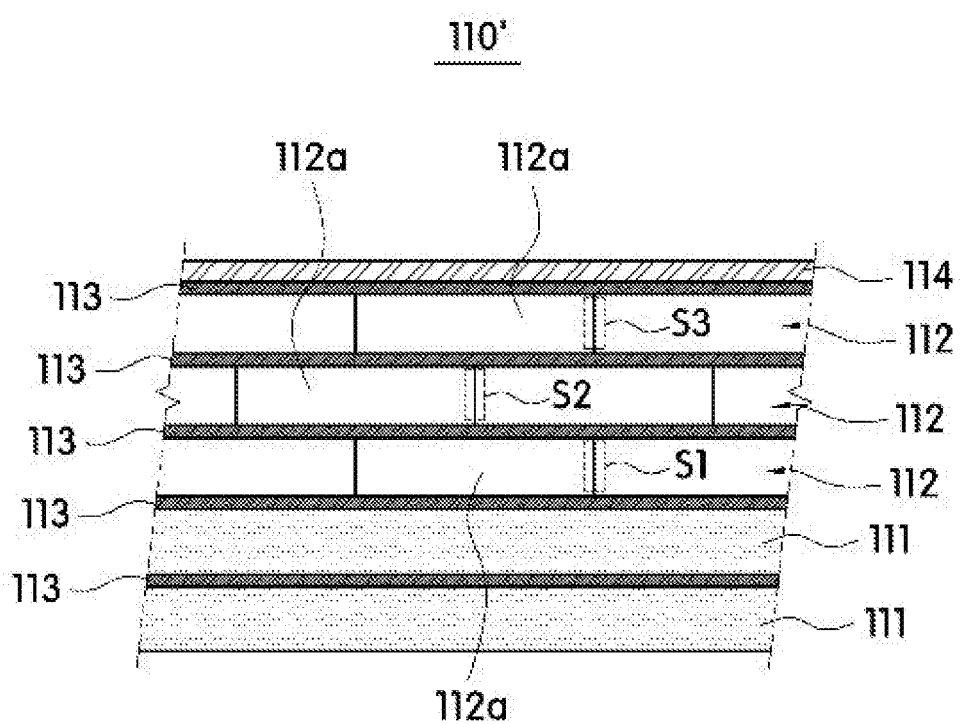
FIG. 4 is an enlarged sectional view of a portion "A" showing a modification of FIG. 1.
Figure 5:
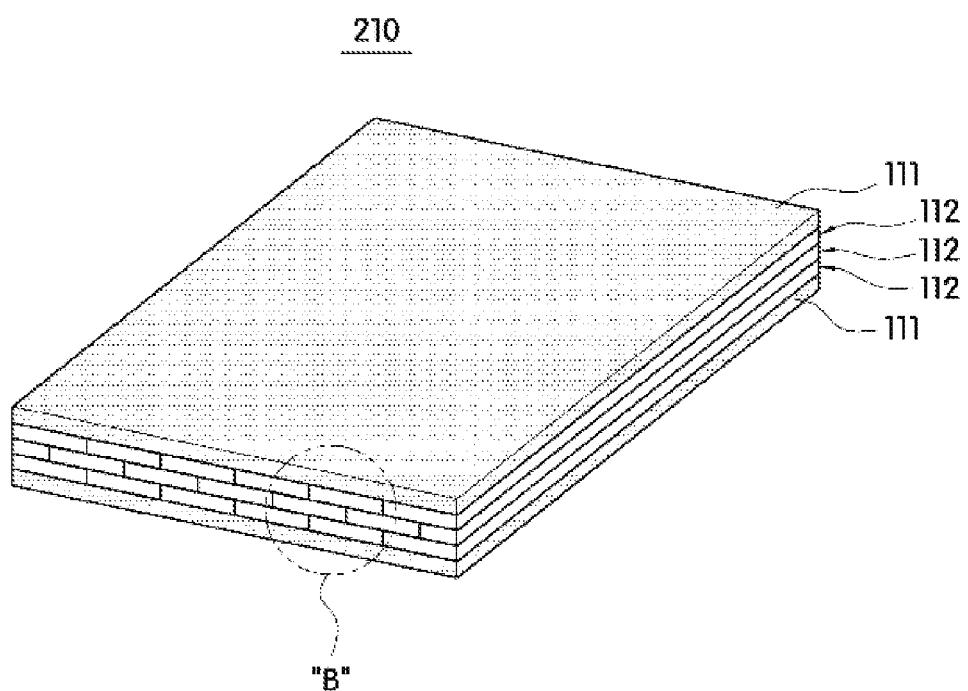
FIG. 5 is a view showing the hybrid metal sheet for magnetic field shielding according to a second embodiment of the present invention.
Figure 6:
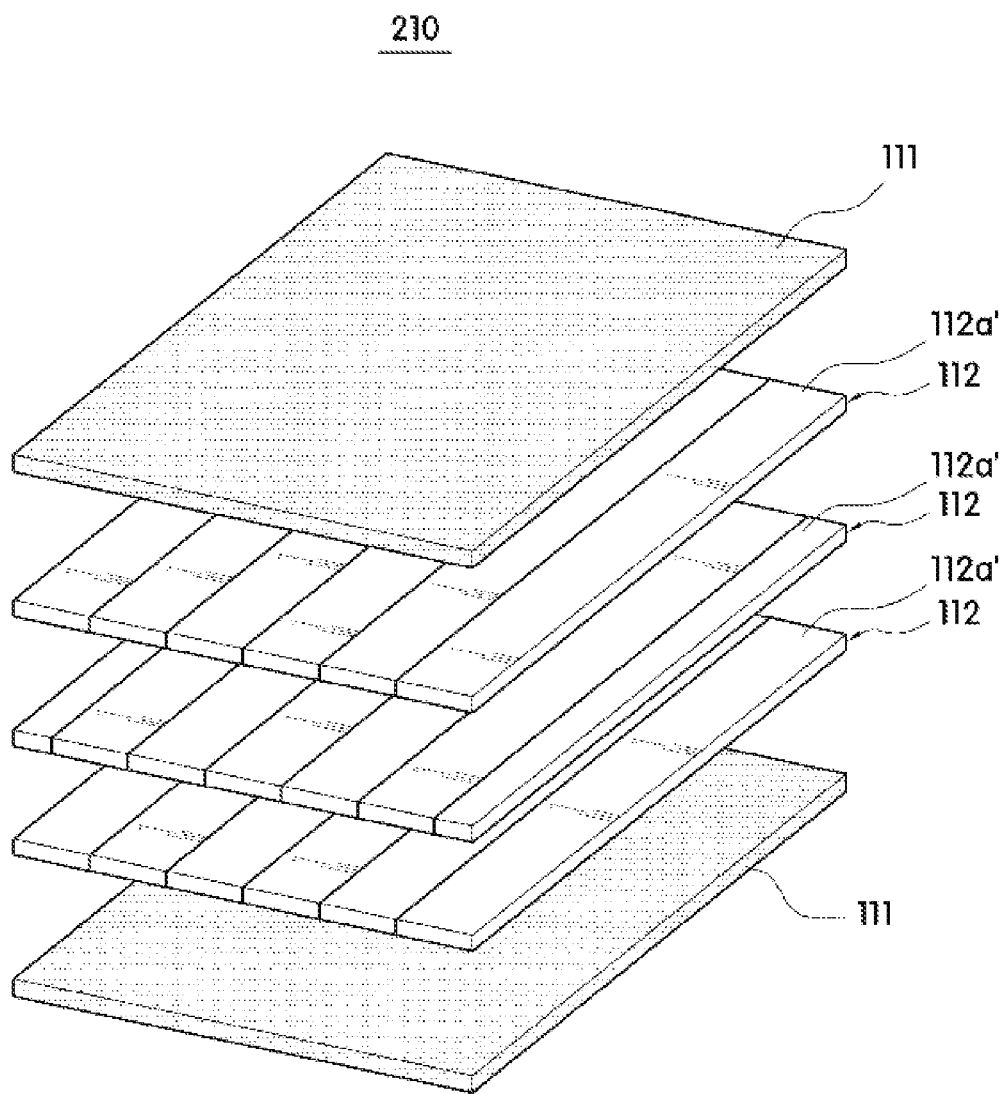
FIG. 6 shows the separation diagram of FIG. 5.
Figure 7:
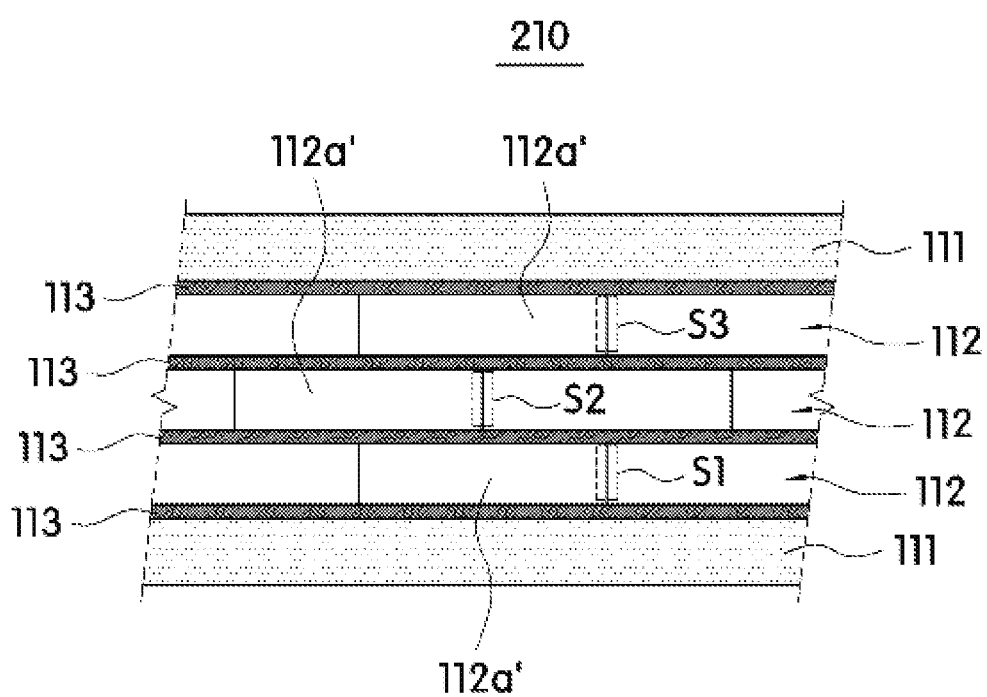
FIG. 7 is an enlarged sectional view of a portion "B" in FIG. 5.
Figure 8:
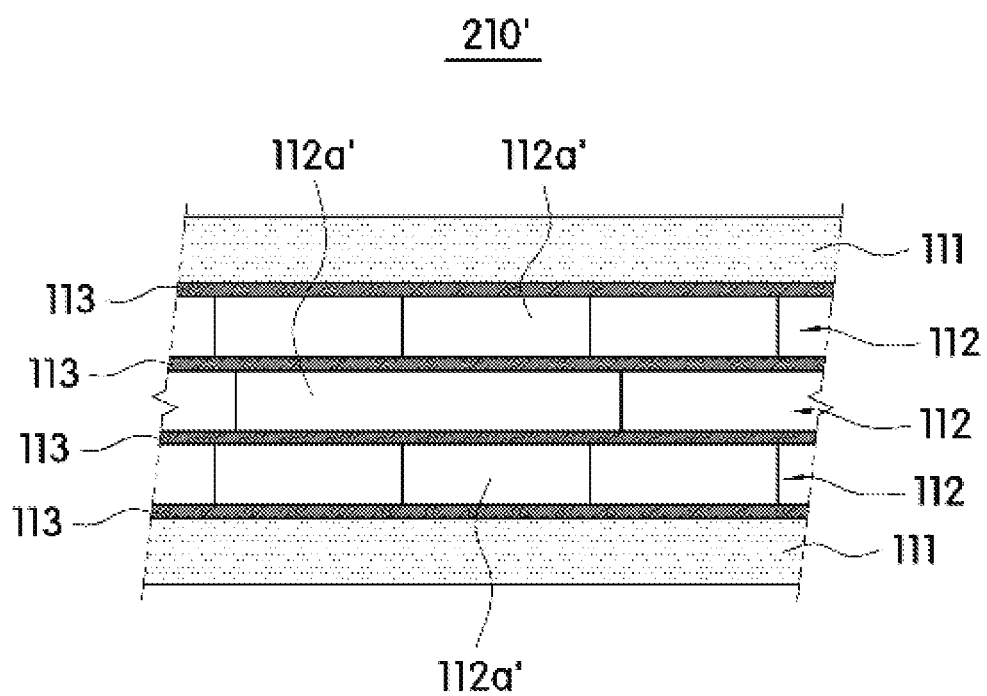
FIG. 8 is an enlarged sectional view of a portion "B" showing a modification of FIG. 5.
Figure 9:
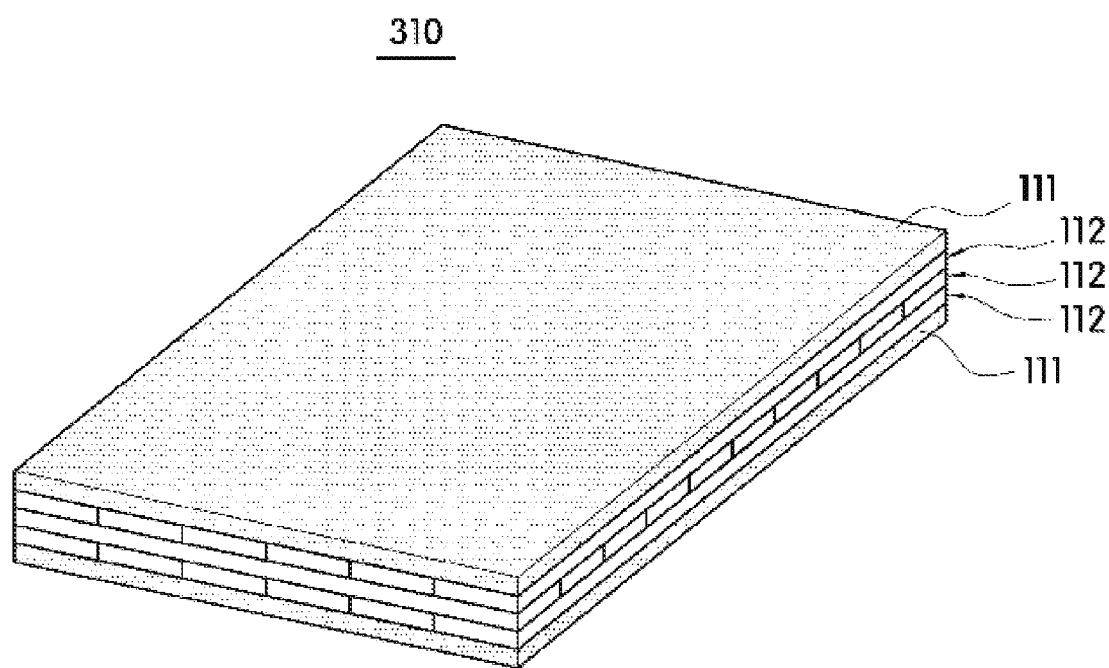
FIG. 9 is a view showing the hybrid metal sheet for magnetic field shielding according to a third embodiment of the present invention.
Figure 10:
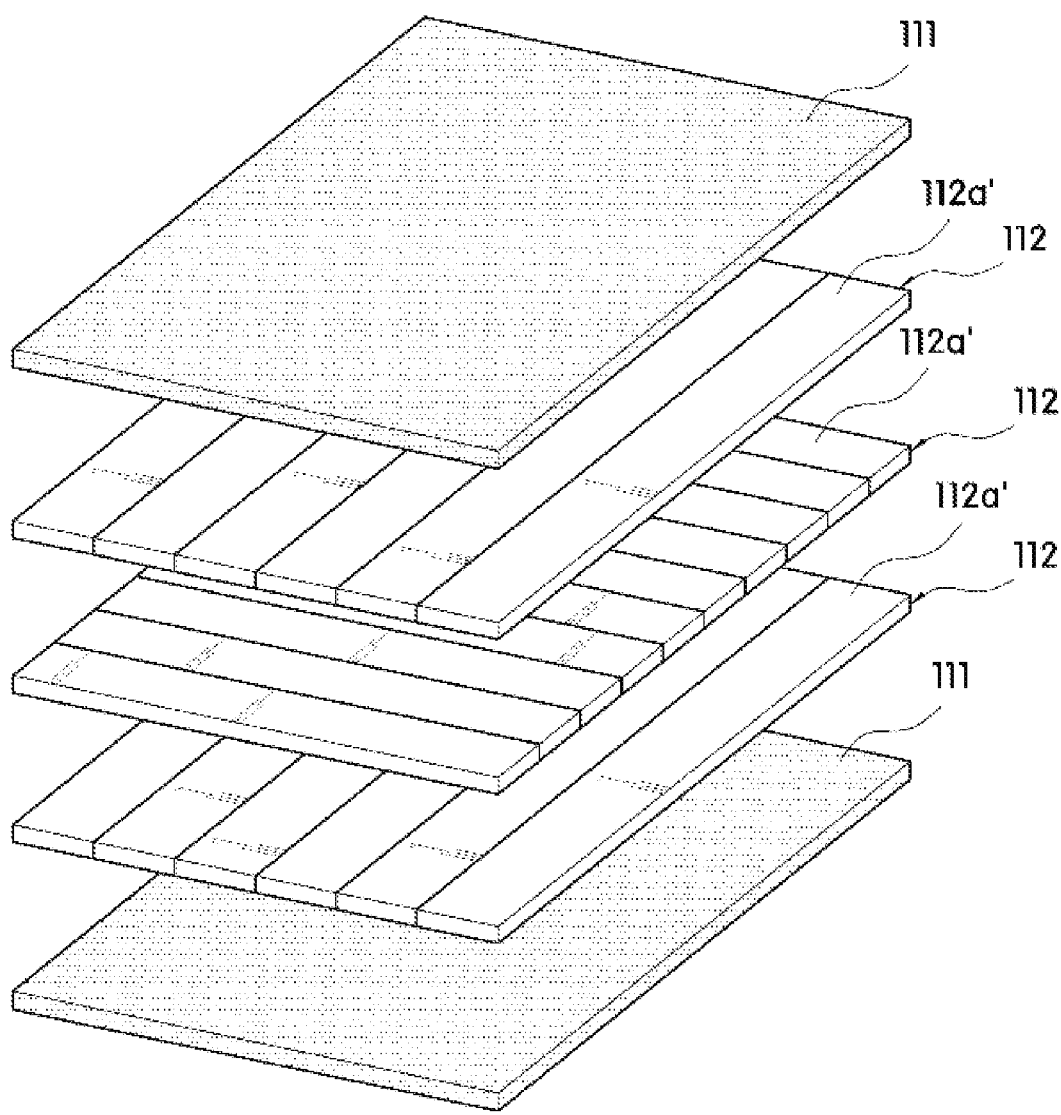
FIG. 10 shows the separation diagram of FIG. 9.

Here, as shown in FIGS. 1 and 2, the plurality of divided sheets 112*a* and 112*a*' may have a length shorter than the entire length of the first sheet layer 111. As shown in FIGS. 5 and 6, the plurality of divided sheets 112*a* and 112*a*' may have a length substantially equal to the total length of the first sheet layer 111.

In addition, the first width may be the same as the overall width of the first sheet layer 111. The second width may be less than the overall width of the second sheet layer 112. The second width may be smaller than the first width.

Generally, even if the ribbon sheet of an amorphous alloy is manufactured so as to have a width of 60 mm or more, there is no difference in production cost to manufacture the ribbon sheet having a width of 90 mm or less. There is a problem in that the production cost of the ribbon sheet of the nano-crystal alloy is increased so as to have a width exceeding 60 mm than to have a width of 60 mm or less.

In order to solve this problem, in the present invention, the ribbon sheet of the nanocrystalline alloy is formed of the divided sheets 112*a* and 112*a*' having a small width, for example, a width of 60 mm or less. In addition, the second sheet layer 112 is disposed so that a plurality of divided sheets 112*a* and 112*a*' are adjacent to each other on the same plane. Therefore, since the ribbon sheet of the nano-crystal alloy having a small width is used, and increasing of the production cost may be prevented.

At this time, the hybrid metal sheet for magnetic field shielding according to the present invention may have a multilayer structure in which a plurality of second sheet layers 112 are stacked.

For example, the hybrid metal sheet for magnetic field shielding may have a structure in which a plurality of divided sheets 112*a* and 112*a*' are arranged so as to be adjacent to each other on the same plane so that each of the second sheet layers 112 constituting one layer is stacked in two or more layers. For example, the plurality of second sheet layers 112 may be a multilayered structure of three to ten layers.

However, it should be noted that the total number of stacked layers of the second sheet layer is not limited thereto, but may be stacked in various layers depending on design conditions. In addition, the plurality of divided sheets 112*a* and 112*a*' constituting each second sheet layer 112 may have the same width (refer to FIGS. 3, 4 and 7), and may have different widths (refer to FIG. 8).

Here, the adhesive layer 113 may be disposed between the pair of second sheet layers 112, which are laminated to each other. An adhesive layer 113 may be disposed between the pair of second sheet layers 112 stacked on each other. The adhesive layer 113 may be a film-like substrate and a liquid or gel-like adhesive agent having adhesive properties on at least one side of the substrate, and include a non-conductive component.

In this case, the adhesive agent may partially penetrate the boundary regions S1, S2, and S3 formed between two neighboring divided sheets. When the adhesive agent contains a nonconductive component, a pair of neighboring divided sheets 112*a* and 112*a*' may be insulated from each other through the adhesive agent permeated in the boundary regions S1, S2, and S3.

In addition, two divided sheets adjacent to each other among the plurality of divided sheets 112*a* and 112*a*' disposed adjacent to each other on the same plane may be disposed so that one ends thereof directly come into direct contact with each other, or spaced apart from each other.

In an exemplary embodiment, as shown in FIGS. 1 to 4, the hybrid metal sheets 110 and 110' for magnetic field shielding according to the present invention may have a multilayer structure in which the plurality of second sheet layers 112 are stacked on one surface of the first sheet layer 111.

At this time, the plurality of divided sheets 112*a* forming each second sheet layer 112 may have a length shorter than the length of the first sheet layer 111, and may be arranged in a matrix structure of m×n (m, n is a natural number). For example, the plurality of divided sheets 112*a* may be arranged in a 4×2 matrix structure such that eight sheets having the same width and length are adjacent to each other, thereby forming each second sheet layer 112. An adhesive layer 113 may be disposed between the respective sheet layers 111 and 112 (112 and 112).

However, it should be noted that the number of the plurality of divided sheets 112*a* constituting the second sheet layer 112 is not limited thereto, and various numbers may be used. In addition, the plurality of second sheet layers 112 composed of multiple layers may have the same matrix structure or different matrix structures. For example, the second sheet layer having a 4×2 matrix structure and the second sheet layer having a 2×4 matrix structure may be alternately stacked.

At this time, a boundary region S2 formed between a pair of divided sheets 112*a* disposed adjacent to each other to form any one second sheet layer 112 of the plurality of second sheet layers 112 may be arranged to be continuous (refer to FIG. 3) or discontinuous (refer to FIG. 4) a boundary region S1 and S3 formed between a pair of divided sheets 112*a* disposed adjacent to each other to form another second sheet layer 112 disposed on the upper or lower portion of any one of the second sheet layers.

In other words, the boundary regions S1 and S3 formed in the second sheet layer 112, which are respectively disposed on the upper and lower portions of the second sheet layer 112 of the plurality of second sheet layers 112 may be located on the same straight line, or not located on the same straight line.

Preferably, when a plurality of second sheet layers 112 are stacked in multiple layers, each of the boundary regions S1, S2, and S3 formed between the pair of divided sheets 112*a* disposed adjacent to each other to constitute the respective second sheet layers 112 may be formed in a zigzag manner along the stacking direction of the second sheet layer 112.

This is so that the boundary region S2 formed between the pair of divided sheets 112*a* arranged in the horizontal direction may be always covered and supported by the other divided sheets 112*a* stacked on the upper or lower portion. Therefore, it is to improve the adhesion between the second sheet layers 112 and to increase the structural rigidity.

Meanwhile, the first sheet layer 111 disposed on one side of the second sheet layer 112 may be a single layer, but may be formed by stacking a plurality of first sheet layers 111 in multiple layers. For example, the hybrid metal sheets 110 and 110' for magnetic field shielding according to the present invention may have a five-layer structure in which a first sheet layer 111 composed of two layers is laminated on one surface of a second sheet layer 112 composed of three layers.

In this case, a separate protective film 114 may be attached to the exposed surface of the second sheet layer 112 disposed opposite to the first sheet layer 111 via the adhesive layer 113.

As another exemplary embodiment, the magnetic field shielding hybrid metal sheets 210, 210', 310 according to the present invention may include a plurality of second sheet layers between two first sheet layers 111 as shown in FIGS. 5 to 10. The plurality of divided sheets 112a' forming the respective second sheet layers 112 may be arranged to be adjacent to each other along one direction of the first sheet layer 111.

Specifically, the plurality of divided sheets 112a forming the respective second sheet layers 112 may be disposed adjacent to each other in the same direction along one of the width direction and the longitudinal direction of the first sheet layer 111 to form a single second sheet layer 112 (refer to FIGS. 5 to 8).

That is, all of the divided sheets 112a' forming each second sheet layer 112 are arranged in parallel along the width direction of the first sheet layer 111, or in the longitudinal direction of the first sheet layer 111. The adhesive layer 113 may be disposed between the respective sheet layers 111 and 112 (112 and 112).

At this time, a boundary region S2 formed between a pair of divided sheets 112a' disposed adjacent to each other to constitute any one of the second sheet layers 112 of the plurality of second sheet layers 112 may be arranged to be continuous (refer to FIG. 3) or discontinuous (refer to FIGS. 7 and 8) with S1 and S3 formed between a pair of divided sheets adjacent to each other to form another second sheet layer 112 disposed on the upper or lower portion of the one of the second sheet layers 112.

In other words, the boundary regions S1 and S3 formed in the second sheet layer 112, which are respectively disposed on the upper and lower portions of the second sheet layer 112 of the plurality of second sheet layers 112 may be located on the same straight line, or not located on the same straight line.

Preferably, when a plurality of second sheet layers 112 are stacked in multiple layers, each of the boundary regions S1, S2, and S3 formed between the pair of divided sheets 112a disposed adjacent to each other to constitute the respective second sheet layers 112 may be formed in a zigzag manner along the stacking direction.

The boundary region S2 formed between the pair of divided sheets 112a arranged in the horizontal direction may be always covered and supported by the other divided sheets 112a stacked on the upper portion or the lower portion. Thus, the adhesion between the second sheet layers 112 may be improved and the structural rigidity may be increased.

As another exemplary embodiment, the hybrid metal sheet 310 for magnetic field shielding according to the present invention may include a plurality of divided sheets 112a' constituting one of a plurality of second sheet layers 112 stacked in multiple layers, the plurality of divided sheets 112a' constituting another second sheet layer 112 disposed on the upper or lower portion of any one of the second sheet layers 112 may be arranged in different directions.

That is, the plurality of divided sheets 112a' constituting one of a plurality of second sheet layers 112 stacked in a multilayer may be arranged along a first direction. The plurality of divided sheets 112a' constituting the other second sheet layer 112 disposed on the upper portion or the lower portion of any one of the second sheet layers 112 may be arranged along a second direction different from the first direction. Specifically, a plurality of divided sheets 112a' constituting any one of a plurality of second sheet layers 112 stacked in a multilayer form may be divided in a width direction of the first sheet layer 111. A plurality of divided sheets 112a' disposed on the upper or lower portion of any one of the second sheet layers 112 and forming the other second sheet layer 112 may be arranged in the longitudinal direction of the first sheet layer 111.

An adhesive layer 113 may be disposed between the sheet layers 111 and 112 (112 and 112), which are laminated together.

In this case, the divided sheet 112a' arranged along the width direction of the first sheet layer 111 and the divided sheet 112a' arranged along the longitudinal direction of the first sheet layer 111 may be stacked in the stacking direction respectively. Therefore, the second sheet layer 112 implemented through the divided sheet arranged along the width direction of the first sheet layer 111 and other the second sheet layer 112 implemented through the divided sheet arranged along the longitudinal direction of the first sheet layer 111 may be alternately arranged along the stacking direction.

The divided sheets 112a' arranged along the width direction of the first sheet layer 111 may be supported by the divided sheets 112a' arranged along the longitudinal direction of the first sheet layer 111. Even if the plurality of second sheet layers 112 are separated from each other through the divided sheets, the adhesion between the adjacent second sheet layers 112 may be improved and the structural rigidity may be further increased.

Figure 11:
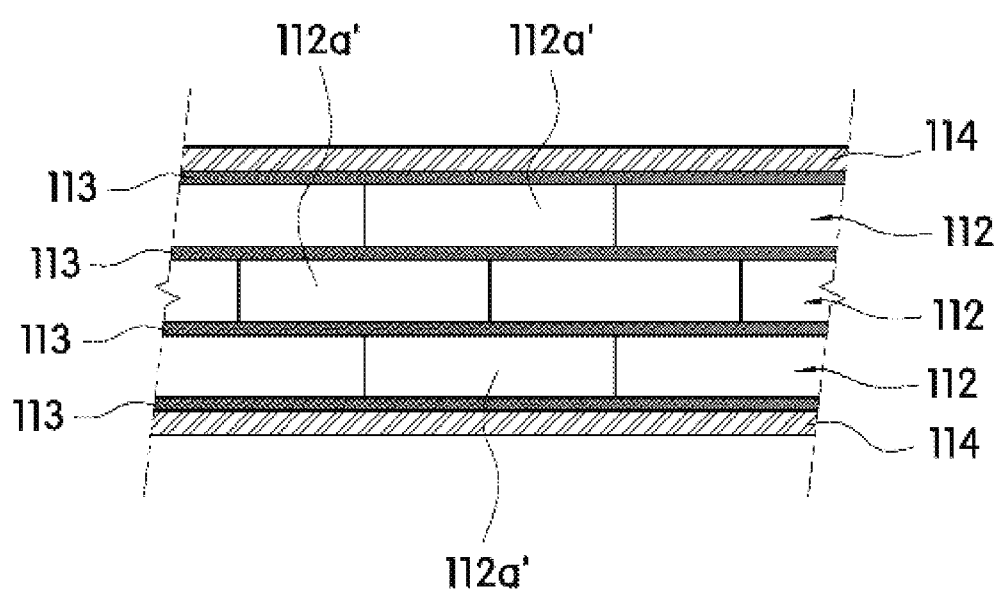
FIG. 11 is a sectional view showing the hybrid metal sheet for magnetic field shielding according to a fourth embodiment of the present invention.

It should be noted that the hybrid metal sheet 410 for magnetic field shielding according to the present invention may be realized by stacking multiple layers of the ribbon sheet of nano-crystal alloy without using the ribbon sheet of an amorphous alloy. That is, as shown in FIG. 11, the plurality of divided sheets 112a' made of a nano-crystal alloy may be disposed adjacent to each other to form one sheet layer 112, and each of the sheet layers 112 may be formed as a multilayered lamination via the adhesive layer 113. At this time, the hybrid metal sheet 410 for magnetic field shielding may include a protective film 114 attached to the uppermost layer and the lowermost layer via the adhesive layer 113.

In addition, although not shown, the hybrid metal sheet for magnetic field shielding according to the present invention may be formed by stacking the second sheet layer 112 with multilayer in form of FIGS. 5 to 10, and the first sheet layer 111 may be laminated on a side of the second sheet layer 112 disposed at the uppermost or lowermost portion. In this case, it is noted that the first sheet layer 111 may be formed by stacking two or more layers of the ribbon sheet of the amorphous alloy in the same manner as in the embodiment shown in FIGS. 1 and 2.

Meanwhile, the above-described hybrid metal sheets 110, 110', 210, 210', 310, and 410 for magnetic field shielding may be applied to the wireless power transmission module 100. That is, the wireless power transmission module 100 may include the antenna unit 120 and the hybrid metal sheets 110, 110', 210, 210', 310, 410 for magnetic field shielding (refer to FIG. 12).

The antenna unit 120 may include at least one antenna that uses a predetermined frequency band, and configured to perform a predetermined function using the frequency band.

The antenna unit 120 may include a plurality of antennas that perform different roles and may be fixed to one surface of the magnetic field shielding hybrid metal sheets 110, 110', 210, 210', 310, and 410 through the adhesive layer.

In the present invention, the antenna may be provided in a circular, elliptical or quadrangular plate-like coil in which a conductive member having a predetermined length is wound a plurality of times in a clockwise or counterclockwise direction.

The antenna may be fixed to one surface of the magnetic field shielding hybrid metal sheets 110, 110', 210, 210', 310, and 410.

The antenna may be formed by patterning a conductor such as a copper foil in a loop shape on at least one surface of the circuit board 124 made of a synthetic resin such as polyimide (PI) or PET, or in a loop-like pattern using conductive ink.

In addition, when the antenna unit includes a plurality of antennas, the plurality of antennas may be configured such that a flat coil and a patterned antenna on the circuit board are combined with each other.

The antenna unit 120 may be configured together a portion that performs a role of a reception coil (Rx coil) (secondary coil) or a transmission coil (Tx coil) for producing power of a portable electromagnetic device that transmits and receives a wireless power signal, and other parts of the below description.

That is, the antenna unit 120 may include at least one antenna 121 for wireless power transmission for receiving or transmitting wireless power. In addition to the wireless power transmission antenna 121, the wireless power transmission antenna 121 may further include at least one other antenna 122 and 123 using a different frequency band.

For example, the other antennas 122 and 123 may be an antenna 122 for an MST (Magnetic Secure Transmission) or an antenna 123 for an NFC (Near Field Communication), and the antenna unit 120 may include at least one of antenna 122 for MST, and an antenna 123 for NFC.

The hybrid metal sheets 110, 110', 210, 210', 310, 410 for magnetic field shielding may be disposed on one surface of the antenna unit 120 to shield the magnetic field generated by the antenna unit 120, to improve the performance of an antenna operating in a frequency band.

The hybrid metal sheets 110, 110', 210, 210', 310, 410 for magnetic field shielding may be disposed on one surface of the antenna unit 120 and shield the magnetic field generated by the antenna unit 120 to increase condensing speed of the magnetic field, thereby enhancing the performance of an antenna operating in a predetermined frequency band.

The magnetic field shielding hybrid metal sheets 110, 110', 210, 210', 310, 410 may be stacked at least one first sheet layer 111 made of a ribbon sheet of an amorphous alloy and a multilayer second sheet layer made of a ribbon sheet of a nanocrystalline alloy 112 and a multilayer made of ribbon sheets of nano-crystal alloy.

Accordingly, even if the antenna unit 120 includes a plurality of antennas using different frequencies, particularly a high frequency band and a low frequency band, the performance of the antenna may be enhanced through one sheet.

Since the hybrid metal sheets 110, 110', 210, 210', 310, and 410 for magnetic field shielding is the same as those described above, detailed description thereof will be omitted.

The hybrid metal sheets 110, 110', 210, 210', 310, and 410 for magnetic field shielding and the wireless power transmission module 100 may be applied to the wireless power transmission of the Qi standard method and PMA standard method, or the wireless power transmission using a permanent magnet. In addition, the antenna unit 120 may include the wireless power transmission antenna 121 that operates in a magnetic-induction method and an A4WP antenna that operates in a magnetic resonant method.

In addition, the wireless power transmission module 100 may perform a role of a wireless power transmission module or a wireless power reception module.

Figure 13:
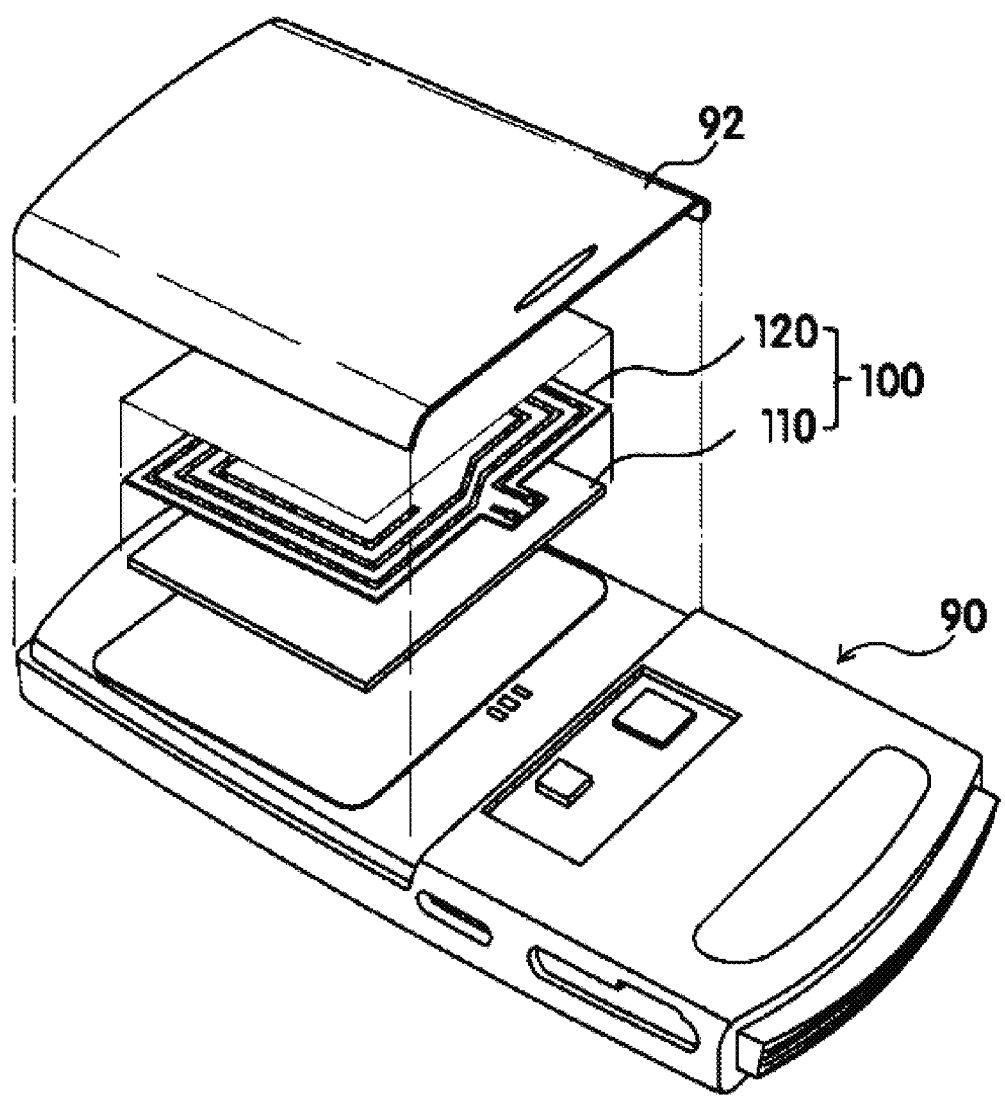
FIG. 13 is a diagram illustrating a state in which the wireless power transmission module according to the present invention is applied to a portable terminal.

For example, when the wireless power transmission module 100 functions as the wireless power receiving module, the wireless power transmission module 100 may be mounted on a back cover or a rear case 92 of a portable electronic device body 90 such as the portable terminal (refer to FIG. 13).

In addition, the above-described hybrid metal sheets 110, 110', 210, 210', 310, and 410 for magnetic field shielding may be realized in a form having a large area through the above-described method in addition to a small or portable electronic device such as the portable terminal, or to the wireless power transmission module 100 for charging a battery of a mobile body or a carrier such as a vehicle or a drone.

As described above, the present invention has been described with respect to particularly preferred embodiments. However, the present invention is not limited to the above embodiments, and it is possible for one who has an ordinary skill in the art to make various modifications and variations, without departing off the spirit of the present invention.

What is claimed is:

1. A hybrid metal sheet for magnetic field shielding comprising
   a first sheet layer made of a ribbon sheet of an amorphous alloy having a first width; and
   a plurality of second sheet layers laminated in multiple layers on one surface of the first sheet layer;
      wherein the second sheet layer is a sheet layer formed by arranging a plurality of divided sheets of a ribbon sheet of a nano-crystal alloy on the same plane and has a second width narrower than the first width,
      wherein the plurality of second sheet layers is arranged such that a plurality of divided sheets for constituting each layer are arranged in the same direction along a width direction or a longitudinal direction of the first sheet layer, and
      wherein a boundary region formed between two divided sheets constituting one of a plurality of second sheet layers is continuous or discontinuous with a boundary region formed between the divided sheets constituting another second sheet layer dispose on the upper or lower portion of any one of the second sheet layers.

2. The hybrid metal sheet for magnetic field shielding of claim 1, wherein the second sheet layer is in the form of a plurality of divided sheets arranged in an m×n matrix structure (where m and n are natural numbers).

3. The hybrid metal sheet for magnetic field shielding of claim 1, wherein the first sheet layer is disposed only on a side of the second sheet layer.

4. The hybrid metal sheet for magnetic field shielding of claim 3, wherein the first sheet layer is laminated in multiple layers.

5. The hybrid metal sheet for magnetic field shielding of claim 1, wherein the plurality of second sheet layers are disposed between the two first sheet layers.

6. The hybrid metal sheet for magnetic field shielding of claim 1, wherein the plurality of divided sheets for constituting any one of a plurality of second sheet layers is arranged along a first direction and the plurality of divided sheets constituting the second sheet layer disposed on at least one of the upper and lower sides of the one of the second sheet layers is arranged along a second direction different from the first direction.

7. The hybrid metal sheet for magnetic field shielding of claim 1, wherein the plurality of second sheet layers is stacked in a multilayer of three to ten layers.

8. The hybrid metal sheet for magnetic field shielding of claim 1, wherein the amorphous alloy is a Fe-based amorphous alloy.

9. A wireless power transmission module comprising:
   an antenna unit including at least one antenna for wireless power transmission; and
   the hybrid metal sheet for magnetic field shielding of claim 1 disposed on a surface of the antenna unit,
wherein the hybrid metal sheet for magnetic field shielding are comprising:
   a first sheet layer made of a ribbon sheet of an amorphous alloy having a first width; and
   a plurality of second sheet layers laminated in multiple layers on one surface of the first sheet layer,
wherein the second sheet layer is a sheet layer formed by arranging a plurality of divided sheets of a ribbon sheet of a nano-crystal alloy on the same plane and has a second width narrower than the first width.

10. The wireless power transmission module of claim 9, wherein the antenna unit further includes at least one other antenna using a different frequency band than the antenna for wireless power transmission.

11. The wireless power transmission module of claim 10, wherein the other antenna is an NFC antenna or an MST antenna.

* * * * *